United States Patent
Iizuka et al.

(10) Patent No.: US 6,700,312 B2
(45) Date of Patent: Mar. 2, 2004

(54) QUARTZ OSCILLATOR DEVICE

(75) Inventors: Minoru Iizuka, Hyogo (JP); Hiroyuki Ishihara, Hyogo (JP); Yoshikiyo Ogasawara, Hyogo (JP); Akihiro Mori, Hyogo (JP); Susumu Hirao, Hyogo (JP); Tatsuya Murakami, Hyogo (JP)

(73) Assignee: Daishinku Corporation, Hyogo (JP)

( * ) Notice: Subject to any disclaimer, the term of this patent is extended or adjusted under 35 U.S.C. 154(b) by 2 days.

(21) Appl. No.: 09/959,476

(22) PCT Filed: Mar. 2, 2001

(86) PCT No.: PCT/JP01/01627
§ 371 (c)(1),
(2), (4) Date: Oct. 26, 2001

(87) PCT Pub. No.: WO01/67600
PCT Pub. Date: Sep. 13, 2001

(65) Prior Publication Data
US 2002/0158699 A1 Oct. 31, 2002

(30) Foreign Application Priority Data

| Mar. 3, 2000 | (JP) | .......................................... 2000-58978 |
| Jun. 16, 2000 | (JP) | ....................................... 2000-182151 |
| Jan. 10, 2001 | (JP) | ....................................... 2001-003068 |

(51) Int. Cl.⁷ .......................................... H01L 41/047
(52) U.S. Cl. ...................................................... 310/364
(58) Field of Search ................................ 310/361, 363, 310/364

(56) References Cited

U.S. PATENT DOCUMENTS

| 3,891,873 A | * | 6/1975 | Yanagisawa et al. | ........ 310/364 |
| 4,259,607 A | * | 3/1981 | Noguchi et al. | ............ 310/364 |
| 5,325,012 A | * | 6/1994 | Sato et al. | .................. 228/121 |
| 2002/0024271 A1 | * | 2/2002 | Hori et al. | .................. 310/364 |

FOREIGN PATENT DOCUMENTS

| JP | 3190410 | 8/1991 | ............ H03H/9/19 |
| JP | 7240655 | 9/1995 | ............ H03H/9/02 |
| JP | 7283683 | 10/1995 | ............ H03H/9/17 |
| JP | 7-49862 | 11/1995 | ............ H03H/9/19 |
| JP | 2000040935 | 2/2000 | ............ H03H/9/02 |
| JP | 2000151345 | 5/2000 | ............ H03H/9/19 |

* cited by examiner

Primary Examiner—Thomas M. Dougherty
(74) Attorney, Agent, or Firm—Rader, Fishman & Grauer PLLC

(57) ABSTRACT

A quartz oscillator device of the present invention comprises a quartz oscillating plate having two major surfaces, each of which is formed with an excitation electrode and lead electrodes drawn out of the excitation electrode, and electrode pads formed on a base, wherein the quartz oscillating plate and the electrode pads are electrically connected via a silicone-based conductive adhesive. Among the excitation electrode and the lead electrodes, at least each of the lead electrodes comprises a Cr film layer, a Au film layer, and a thin Cr film layer or a thin Ag film layer, which are laminated on the quartz oscillating plate in this order. In addition, each electrode pad comprises a metallized layer made of tungsten or molybdenum, a Ni film layer and a Au film layer, which are laminated on the base in this order; and Ni in the Ni film layer is diffused at least into a predetermined area of the Au film layer in each electrode pad where the silicone-based conductive adhesive is applied.

9 Claims, 8 Drawing Sheets

Fig.12

| Drop distance (cm) | Conventional item | Examples | | | | | | | | | | |
|---|---|---|---|---|---|---|---|---|---|---|---|---|
| | | A | B | C | D | E | F | G | H | I | J | K |
| 120 | 100 | 100 | 100 | 100 | 100 | 100 | 100 | 100 | 100 | 100 | 100 | 100 |
| 150 | 100 | 100 | 100 | 100 | 100 | 100 | 100 | 100 | 100 | 100 | 100 | 100 |
| 180 | 93 | 97 | 100 | 100 | 100 | 100 | 100 | 100 | 100 | 100 | 100 | 100 |
| 200 | 79 | 90 | 95 | 95 | 100 | 100 | 100 | 100 | 100 | 95 | 95 | 100 |

(%)

QUARTZ OSCILLATOR DEVICE

TECHNICAL FIELD

The present invention relates to a quartz oscillator device in which a quartz oscillating plate is held attached with the use of a silicone-based conductive adhesive.

BACKGROUND ART

With regard to quartz oscillators such as quartz oscillators and quartz generators, the surface-mount oscillator which employs a ceramic package has come to occupy a dominant share. Moreover, in order to cope with the trend of micro-miniaturization, more and more surface-mount oscillators are arranged to support the quartz oscillating plate without an elastic metal support. Where an elastic support is omitted, the quartz oscillating plate is frequently fixed in the ceramic package with the use of a silicone-based conductive adhesive in order to ensure the impact resistance. The silicone-based conductive adhesive is obtained, for example, by adding a silicone resin-based adhesive with a conductive filler. The silicone-based conductive adhesive, which keeps its flexibility after curing, is superior in alleviating an external stress acting on the quartz oscillating plate.

As a conventional example, a surface-mount oscillator is mentioned with reference to FIG. 13. This surface-mount quartz oscillator comprises a ceramic package 7 whose external configuration is a near rectangular solid and which includes a recess opening at the top, a rectangular quartz oscillating plate 8 which is housed in the ceramic package 7 as a piezoelectric oscillating component, and a metal lid 9 which is bonded at the opening of the ceramic package 7.

The ceramic package 7 is composed of a ceramic body 70 with a recess and a metal layer 71 which is provided along the top surface of the peripheral wall 701 of the ceramic body 70. The metal layer 71 is composed of a metallized layer of tungsten, etc., and a Ni-plated layer and an ultrathin Au-plated layer successively laminated on the metallized layer. On the internal bottom surface of the ceramic package 7, two electrode pad layers 72 are provided in the direction of short sides (only one such pad is shown). The electrode pads 72 are electrically guided out to the external bottom surface of the package, via connection electrodes 73, by lead electrodes 74, 75, respectively.

The rectangular quartz oscillating plate 8 is cantilevered at one longitudinal end by these two electrode pads 72. The quartz oscillating plate is formed with a pair of excitation electrodes 81, 82 on the front and back surfaces. These excitation electrodes 81, 82 are led out to the sections of the electrode pads 72 and electrically connected therewith by a silicone-based conductive adhesive 300. Each of the excitation electrodes 81, 82 is composed of a Cr film layer and a Au film layer which are laminated in this order by sputtering or vacuum evaporation. In addition, the metal lid 9 is brazed and soldered on the top surface of the metal layer 71 with a silver brazing material 400, whereby hermetic sealing is established.

However, the silicone-based conductive adhesive shows a weak adhesion strength with respect to the Au surface, which may increase the conductive resistance and also cause breakage of the adhesion surface. Considering the Au at the surface does not go through an oxidation reaction and remains stable, the decrease in adhesion strength is presumably because the Au is difficult to bond chemically to the silicone-based conductive adhesive.

In particular, where the quartz oscillating plate is cantilevered, the weight of support or the weight of impact is focused so heavily on the adhesion area as to induce occurrences of breakage. In recent arrangements designed for low-profile devices, the adhesive is applied only on the adhesion surface of the quartz oscillating plate, and not on the top surface thereof. This arrangement has also resulted in deterioration of the adhesion strength.

To compensate for the decreased adhesion strength, prior art (e.g. Japanese Patent Laid-open Publication Nos. H3-190410 and H7-283683) has devised to raise the adhesion strength by applying an adhesive on the base part of the quartz oscillating plate, or by exposing the ceramic base part of the ceramic package (as the base) and applying an adhesive on the exposed base part.

In the recent situation, miniaturization of the quartz oscillator device not only demands a smaller quartz oscillating plate but also allows a less area for lead electrodes. In this respect, if the size of lead electrodes is diminished in the above prior art, the CI (crystal impedance) varies seriously relative to the change of the drive level.

The present invention has been made to solve these problems, with an intention of providing a quartz oscillator device in which the quartz oscillating plate is bonded to the electrode pads on the base by means of a silicone-based conductive adhesive, which device can maintain a good adhesion state and adhesion strength, which can show a remarkable impact resistance, and which can facilitate frequency adjustment in the later step.

DISCLOSURE OF THE INVENTION

In order to solve the above problems, the present invention discloses a structure in which a suitable easily oxidizable metal is provided very thinly at least either on the metal film defining the surface of each lead electrode formed on the quartz oscillating plate or on the metal film defining the surface of each electrode pad formed on the base, so that the quartz oscillating plate and the electrode pads can be bonded by a silicone-based conductive adhesive. This structure is realized by the following arrangements.

A quartz oscillator device corresponding to claim 1 comprises a quartz oscillating plate having two major surfaces, each of which is formed with an excitation electrode and lead electrodes drawn out of the excitation electrode, and electrode pads formed on a base, wherein the quartz oscillating plate and the electrode pads are electrically connected via a silicone-based conductive adhesive. This quartz oscillator device is characterized in that, among the excitation electrode and the lead electrodes, at least each of the lead electrodes comprises a Cr film layer, a Au film layer, and a thin Cr film layer or a thin Ag film layer, which are laminated on the quartz oscillating plate in this order.

In the arrangement of claim 1, a thin Cr film layer or a thin Ag film layer is formed as the uppermost layer of each lead electrode. As a result, when the silicone-based conductive adhesive is employed, not only does the relatively easily oxidizable Cr or Ag improve the adhesion strength, but also the Au film ensures good conductivity.

A quartz oscillator device corresponding to claim 2 comprises a quartz oscillating plate having two major surfaces, each of which is formed with an excitation electrode and lead electrodes drawn out of the excitation electrode, and electrode pads formed on a base, wherein the quartz oscillating plate and the electrode pads are electrically connected via a silicone-based conductive adhesive. This quartz oscillator device is characterized in that each electrode pad comprises a metallized layer made of tungsten or molybdenum, a Ni film layer and a Au film layer, which are laminated on the base in this order; and that Ni in the Ni film layer is diffused at least into a predetermined area of the Au film layer in each electrode pad where the silicone-based conductive adhesive is applied.

The arrangement of claim 2, in which Ni is diffused into the uppermost Au film layer in the electrode pad, can enhance the adhesion strength by the silicone-based conductive adhesive, without increasing the overall film thickness of the electrode pad. Notably, such diffusion is accomplished by a rather simple heat treatment.

A quartz oscillator device corresponding to claim 3 comprises a quartz oscillating plate having two major surfaces, each of which is formed with an excitation electrode and lead electrodes drawn out of the excitation electrode, and electrode pads formed on a base, wherein the quartz oscillating plate and the electrode pads are electrically connected via a silicone-based conductive adhesive. This quartz oscillator device is characterized in that each electrode pad comprises a metallized layer made of tungsten or molybdenum, a Ni film layer, a Au film layer, and a thin Ag film layer or a thin Al film layer, which are laminated on the base in this order.

In the arrangement of claim 3, a thin Ag film layer or a thin Al film layer, formed as the uppermost layer of the electrode pad, increases the thickness of the electrode pad. Nevertheless, this arrangement can enhance the adhesion strength to the silicone-based conductive adhesive, in comparison with the case where the uppermost layer is a Au film layer.

The quartz oscillator device according to claim 2 or 3 may be arranged such that, among the excitation electrode and the lead electrodes, at least each of the lead electrodes comprises a Cr film layer, a Au film layer, and a thin Cr film layer or a thin Ag film layer, which are laminated on the quartz oscillating plate in this order.

According to this arrangement, the uppermost layers of the lead electrodes and those of the electrode pads both comprise not only Au but also a relatively easily oxidizable metal such as Cr, Ag, Al or Ni. As a result, the lead electrodes and the electrode pads can bond well to the silicone-based conductive adhesive, with an increased adhesion strength.

A quartz oscillator device corresponding to claim 5 comprises a quartz oscillating plate having two major surfaces, each of which is formed with an excitation electrode and lead electrodes drawn out of the excitation electrode, and electrode pads formed on a base, wherein the quartz oscillating plate and the electrode pads are electrically connected via a silicone-based conductive adhesive. This quartz oscillator device is characterized in that each of the excitation electrode and the lead electrodes comprises a Cr film layer and a Au film layer, which are laminated on the quartz oscillating plate in this order; and that, among the lead electrodes and the excitation electrode which are opposite to the base, at least each of the lead electrodes comprises a thin Cr film layer or a thin Ag film layer which is laminated on the Au film layer of the lead electrode.

According to claim 5, among the lead electrodes and the excitation electrode which are opposite to the base, at least each of the lead electrodes includes a thin Cr film layer or a thin Ag film layer which is laminated as the uppermost layer. As a result, not only does the relatively easily oxidizable Cr or Ag improve the adhesion strength, but also the Au film ensures good conductivity.

In addition, the Cr film locates only on the back surface of the quartz oscillating plate, i.e. on the side of the electrode pad formed on the base, whereas no Cr film is present on the front surface of the quartz oscillating plate. Consequently, frequency adjustment is efficiently conducted with respect to the Au film on the front surface, and better electrical characteristics are obtained.

The structure of claim 5 may be arranged as recited in claim 6. In this case, each electrode pad may comprise a metallized layer made of tungsten or molybdenum, a Ni film layer and a Au film layer, which are laminated on the base in this order; and Ni in the Ni film layer may be diffused at least into a predetermined area of the Au film layer in each electrode pad where the silicone-based conductive adhesive is applied.

Alternatively, as recited in claim 7, each electrode pad may comprise a metallized layer made of tungsten or molybdenum, a Ni film layer, a Au film layer, and a thin Ag film layer or a thin Al film layer, which are laminated on the base in this order.

Preferably, the thin Cr film layer or the thin Ag film layer has a thickness of 5 to 50 Å.

As for the uppermost layer of each lead electrode or the excitation electrode (i.e. the thin Cr film layer or the thin Ag film layer), a thin film layer with a film thickness is 5 Å or less fails to exhibit the intended effect, and, as a consequence, the adhesion strength is lowered. On the other hand, where the thickness is over 50 Å, the quartz oscillator device shows such a high CI that the oscillation characteristics are adversely affected. In view of these facts, the thin Cr film layer or the thin Ag film layer, as the uppermost layer, should have a thickness in the above-specified range, thereby to enhance the impact resistance and to keep the CI and other electrical characteristics in good conditions.

Further, a quartz oscillator device corresponding to claim 9 may be arranged such that the lead electrodes formed on both major surfaces of the quartz oscillating plate are different from each other in shape or size of the electrode pattern.

This arrangement facilitates the distinction of the front surface and back surface of the quartz oscillating plate which is equipped with these electrodes. To give an example, in order to impart favorable electrical characteristics to the quartz oscillator, the back surface is preferably formed with a thin uppermost Cr film. In this case, it is often difficult to judge the presence or the absence of the Cr film by visual inspection or the image processing technology using a digital camera or the like. However, according to the arrangement of claim 9, such judgement can be made apparently. Besides, with regard to the production utilizing an automated machine, etc., this arrangement can work efficiently and raise a production yield.

BRIEF DESCRIPTION OF DRAWINGS

FIG. 12 is a table which gives the results of the drop test for the present examples and a conventional example, in which the results are indicated by the percentage of good items.

BEST MODE FOR CARRYING OUT THE INVENTION

Taking a surface-mount quartz oscillator as an example, embodiments of the present invention are herein after described with reference to drawings.

First Embodiment

Figure 1:
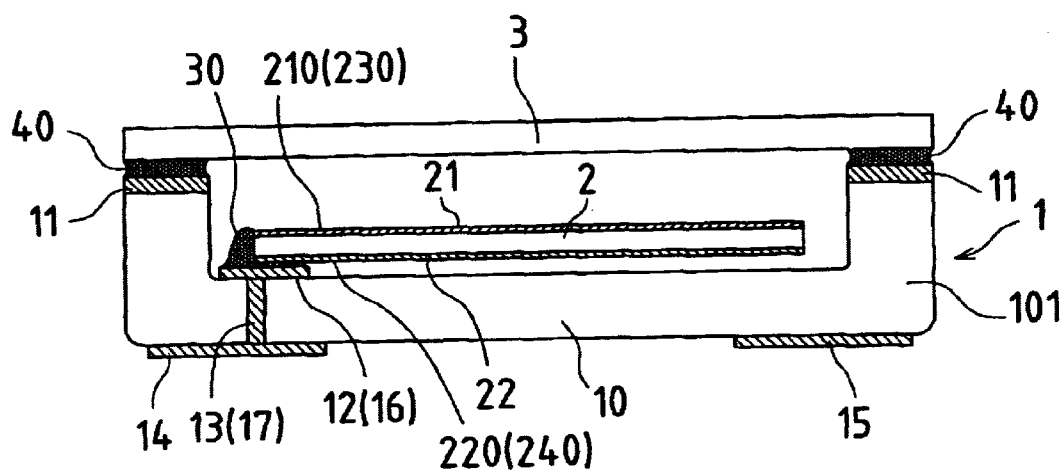
FIG. 1 is a sectional view showing the first embodiment of the present invention.
Figure 2:
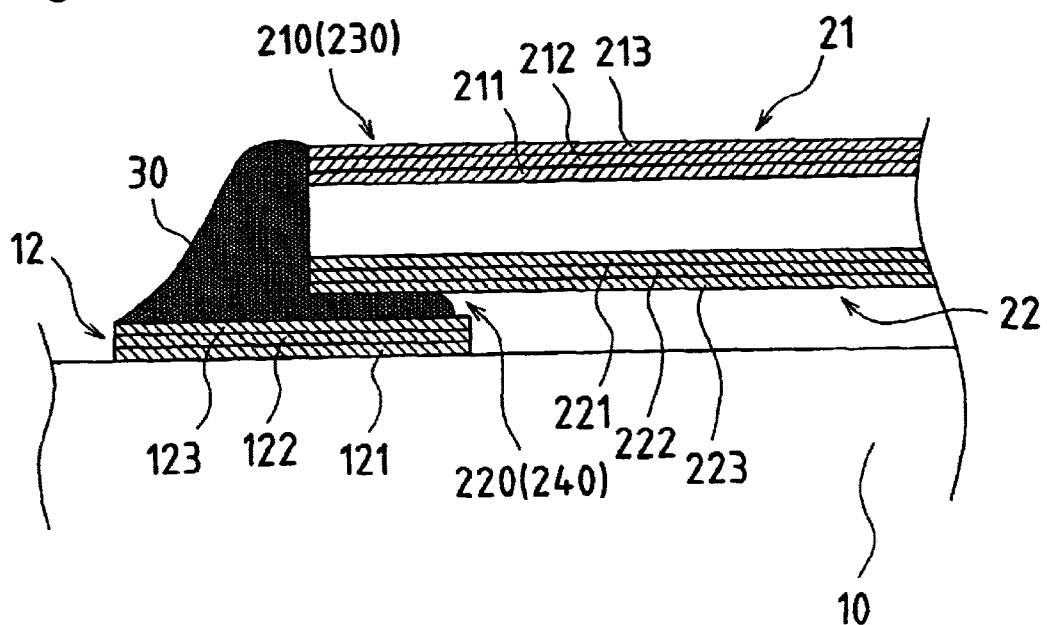
FIG. 2 is an enlarged sectional view of the relevant part in FIG. 1.

FIG. 1 is a sectional view showing the first embodiment of the present invention. FIG. 2 is an enlarged sectional view of the relevant part in FIG. 1.

The present surface-mount quartz oscillator comprises a ceramic package 1 whose external configuration is a rectangular solid and which includes a recess as the base, a rectangular quartz oscillating plate 2 which is mounted as a piezoelectric oscillating component and housed in the ceramic package 1, and a metal lid 3 which is bonded at the opening of the ceramic package 1.

The ceramic package 1 is composed of a ceramic body 10 with a recess and a metal layer 11 which is provided along the top surface of the peripheral wall 101 of the ceramic body 10. The metal layer 11 is composed of a metallized layer of tungsten, a Ni-plated layer laminated on the metallized layer, and an ultrathin Au-plated layer laminated on the Ni-plated layer. As for the thickness of each layer, the metallized layer is about 10 to 20 $\mu$m, the Ni-plated layer is about 2 to 6 $\mu$m, and the Au-plated layer is about 0.5 to 1.0 $\mu$m, to give an example.

On the internal bottom surface (as the base) of the ceramic package 1, electrode pads 12, 16 are arranged side by side in the direction of short sides. The electrode pads are electrically drawn out, via connection electrodes 13, 17, to lead electrodes 14, 15 which are provided on the external bottom surface of the package 1 in a longitudinally opposing manner. In addition, a ground electrode (not shown) is provided on the external bottom surface of the ceramic package 1 and electrically connected to the metal layer 11.

Each electrode pad 12 (16) is composed of a metallized layer 121 made of W (tungsten) or Mo (molybdenum), a Ni film layer 122 and a Au film layer 123, which are formed in this order by plating or the like. In each electrode pad, at least where the silicone-based conductive adhesive is applied, Ni in the Ni film layer 122 which lies below the Au film layer 123 is allowed, by heat treatment, to diffuse into the Au film layer 123 at the surface. In this embodiment, after each of the below-mentioned electrodes is provided, Ni can be diffused into the Au film layer 123 by heating the entire package in a vacuum atmosphere around 300° C. for 2 hours.

For this heat treatment, laser beams or the like may be utilized to effect a local treatment exclusively at the required portion.

A quartz oscillating plate 2 is mounted on the electrode pad 12 (16) section, with one longitudinal end thereof being cantilevered. A pair of excitation electrodes 21, 22 are provided on the front and back surfaces of the quartz oscillating plate 2, and drawn out to the electrode pad 12 (16) section by lead electrodes 210 (230), 220 (240), respectively. For the excitation electrodes 21, 22 and the lead electrodes 210 (230), 220 (240), the respective major surfaces of the quartz oscillating plate 2 are successively laminated with first Cr film layers 211, 221 with a thickness of about 16 Å, Au film layers 212, 222 with a thickness of about 5,000 Å, and second Cr film layers 213, 223 with a thickness of about 10 Å. Each of these film layers is formed by sputtering, vacuum evaporation or the like. The electrode pad 12 (16) is conductively bonded to the lead electrodes 210 (230), 220 (240) by means of a silicone-based conductive adhesive 30. In this embodiment, the silicone-based conductive adhesive 30 is applied only on one surface of the quartz oscillating plate 2.

Incidentally, the second Cr film layers may locate only at the lead electrodes. In this case, the uppermost layer of the excitation electrode section is the Au film. Compared with the relatively hard Cr film, the soft Au film contributes to the characteristics adjustment performed by adjusting the thickness of metal film layers (e.g. by ion milling), so as to enhance the adjustment rate.

As for the metal lid 3, Kovar constitutes the base material and Ni is plated on the surface. Further, a silver brazing material 40 is formed on the metal layer 11. In a vacuum atmosphere or an inert gas atmosphere, the metal lid 3 is mounted on the metal layer 11 via the silver brazing material 40, and brazed and soldered thereon by heating according to a local heating method (e.g. beam soldering, seam soldering, high frequency induction heating). The ceramic package 1 is sealed hermetically in this manner.

Second Embodiment

Figure 3:
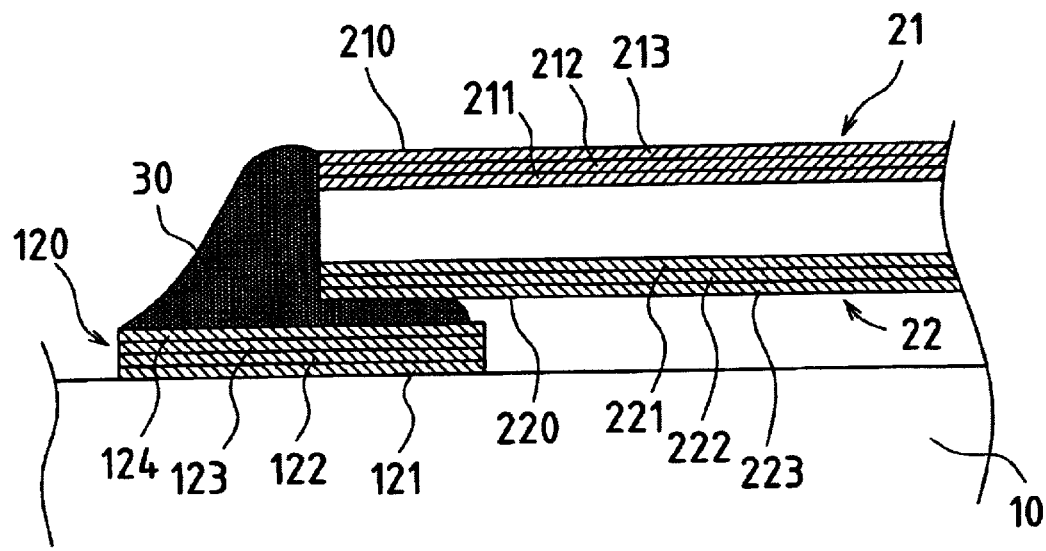
FIG. 3 is an enlarged sectional view showing the relevant part of the second embodiment of the present invention.

FIG. 3 is an enlarged sectional view showing the relevant part of the second embodiment of the present invention. The structures similar to those mentioned in the first embodiment are mentioned by the same reference signs without further explanations.

This embodiment is distinguished from the first embodiment in the structure of the electrode pad. Specifically, the electrode pad 120 has a four-layer structure of a metallized layer 121 made of W (tungsten) or Mo (molybdenum), a Ni film layer 122, a Au film layer 123 and a Ag film layer 124, which are formed in this order by plating or the like.

A quartz oscillating plate 2 is mounted on the electrode pads 120, with one longitudinal end thereof being cantilevered. A pair of excitation electrodes 21, 22 are provided on the front and back surfaces of the quartz oscillating plate 2, and drawn out to each electrode pad 120 section by lead electrodes 210, 220, respectively. For the excitation electrodes 21, 22 and the lead electrodes 210, 220, the respective major surfaces of the quartz oscillating plate 2 are successively laminated with first Cr film layers 211, 221 with a thickness of about 16 Å, Au film layers 212, 222 with a thickness of about 5,000 Å, and second Cr film layers 213, 223 with a thickness of about 10 Å. Each electrode pad 120 is conductively bonded to the lead electrodes 210, 220 by means of the silicone-based conductive adhesive 30.

According to this embodiment, the Ag film which defines the uppermost layer of each electrode pad 120, and the second Cr films which locate at the uppermost layers of the excitation electrodes 21, 22 serve to increase the adhesion strength to the silicone-based conductive adhesive, thus contributing to the improvement of the impact resistance of the quartz oscillator device.

Third Embodiment

Figure 4:
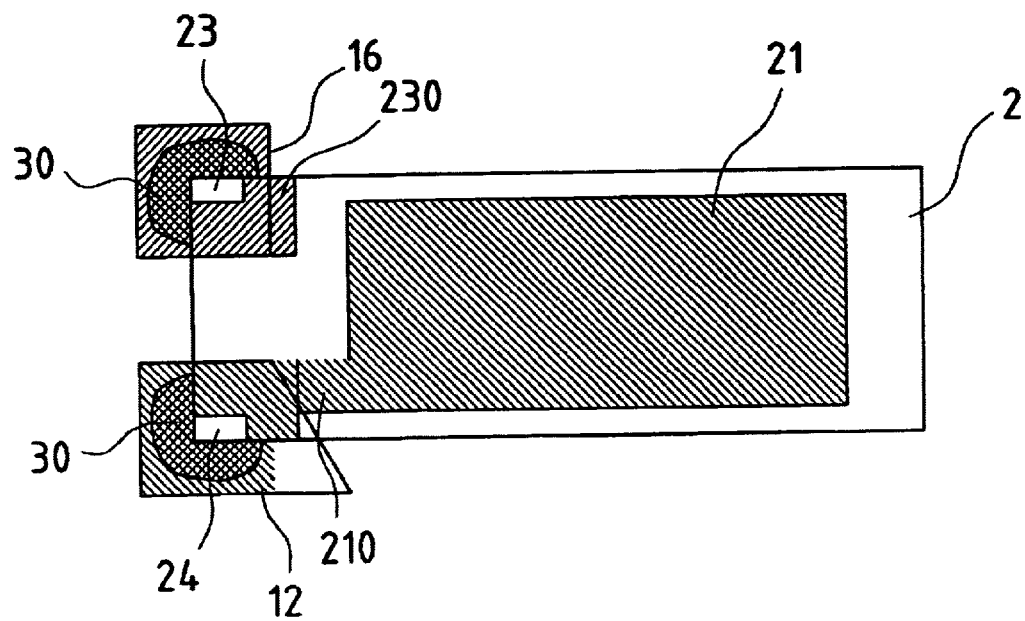
FIG. 4 is a plan view showing the third embodiment of the present invention.

FIG. 4 is a plan view showing the third embodiment of the present invention. The structures similar to those mentioned in the first embodiment are mentioned by the same reference signs without further explanations.

This embodiment is distinguished from the first embodiment in the structure of the lead electrodes.

The electrode pad 12 (16) is composed of a metallized layer 121 made of W (tungsten) or Mo (molybdenum), a Ni film layer 122 and a Au film layer 123, which are formed in this order. With respect to the electrode pad 12 (16), Ni in the Ni film layer 122 is diffused at least into a predetermined area in the Au film layer 123 on which the silicone-based conductive adhesive is applied.

On the other hand, regarding the excitation electrode 21 and the lead electrode 210 which are formed on the quartz oscillating plate 2 to be mounted on the electrode pad 12 (16), a first Cr film layer with a thickness of about 16 Å, and a Au film layer with a thickness of about 5,000 Å are laminated in this order, with the Au film layer exposed at the surface. Furthermore, at the corners of the lead electrodes 210, 230, the base part of the quartz oscillating plate 2 is partially exposed as exposed portions 23, 24. This structure allows the silicone-based conductive adhesive 30 to be applied on the exposed portions 23, 24, so as to ensure the adhesion strength.

Fourth Embodiment

Figure 6:
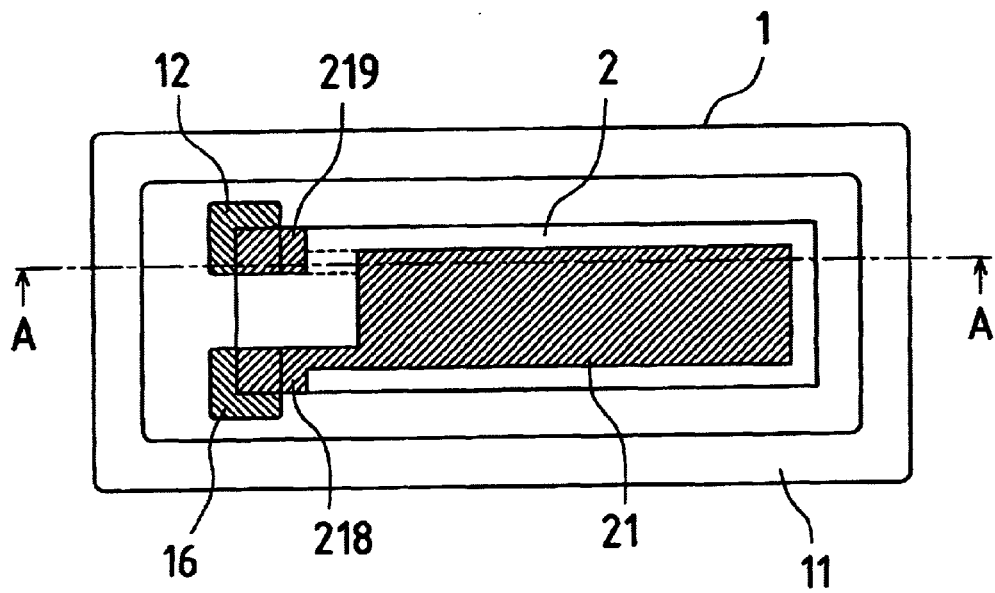
FIG. 6 is a plan view showing the fourth embodiment of the present invention.
Figure 7:
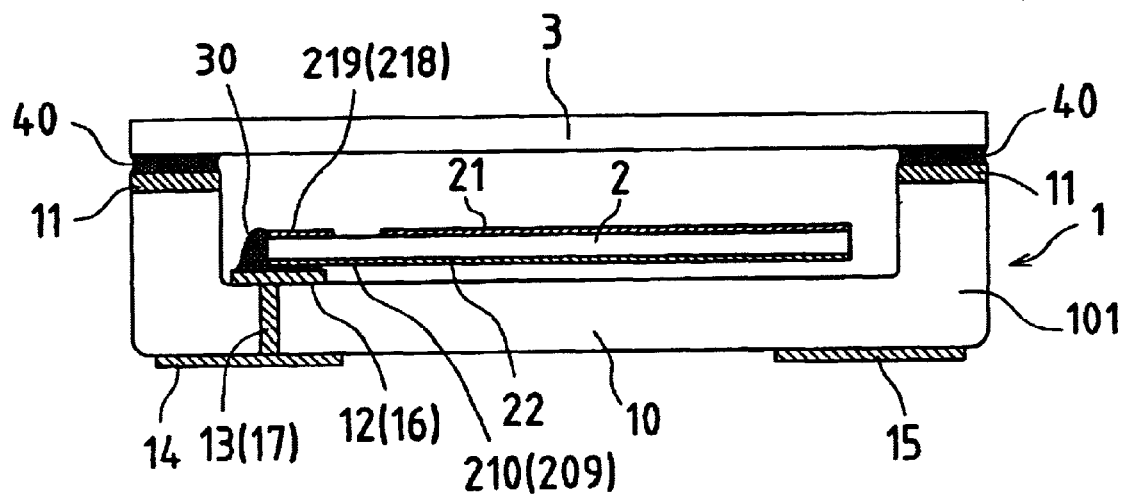
FIG. 7 is a sectional view taken along the line A—A in FIG. 6.
Figure 8:
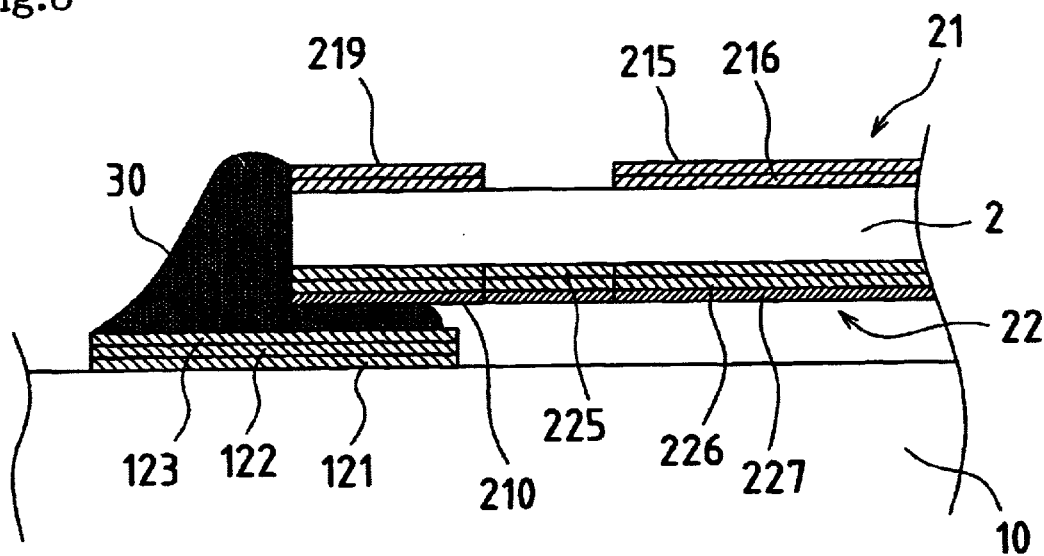
FIG. 8 is an enlarged sectional view showing the relevant part of the fourth embodiment.

FIG. 6 is a plan view showing the fourth embodiment of the present invention. FIG. 7 is a sectional view taken along the line A—A in FIG. 6. FIG. 8 is an enlarged sectional view showing the relevant part of the fourth embodiment.

The structures similar to those mentioned in the first embodiment are mentioned by the same reference signs without further explanations.

This embodiment is distinguished from the first embodiment in the structure of the excitation electrodes and the lead electrodes.

The excitation electrodes 21, 22 are provided on both major surfaces of the quartz oscillating plate 2. Lead electrodes 218, 219 are drawn out of the excitation electrode 21 to the sections of the electrode pads 16, 12. On the other surface, lead electrodes 209, 210 are provided opposite to where the lead electrodes 218, 219 are bonded to the electrode pads 16, 12. The lead electrodes 218, 219 may directly establish conductive connection with the lead electrodes 209, 210, respectively, through a conductive film.

For the excitation electrodes 21, 22 and the lead electrodes 218, 219, 209, 210, the respective major surfaces of the quartz oscillating plate 2 are successively laminated with first Cr film layers 216, 225 with a thickness of about 16 Å, and Au film layers 215, 226 with a thickness of about 5,000 Å. Each of these film layers is formed by sputtering, vacuum evaporation or the like. In addition, a second Cr film layer 227 with a thickness of about 10 Å is formed on the top surface of the excitation electrode 22 and the lead electrode 210 which locate on the electrode pad 12 (16) side. The electrode pad 12 (16) is conductively bonded to the lead electrode 210 (209) by the silicone-based conductive adhesive 30. In this embodiment, similar to the previous ones, the silicone-based conductive adhesive 30 is applied only on the back surface of the quartz oscillating plate 2. Where a low-profile piezoelectric oscillator is required, this structure is effective for reducing the height of the accommodation space.

Fifth Embodiment

Figure 9:
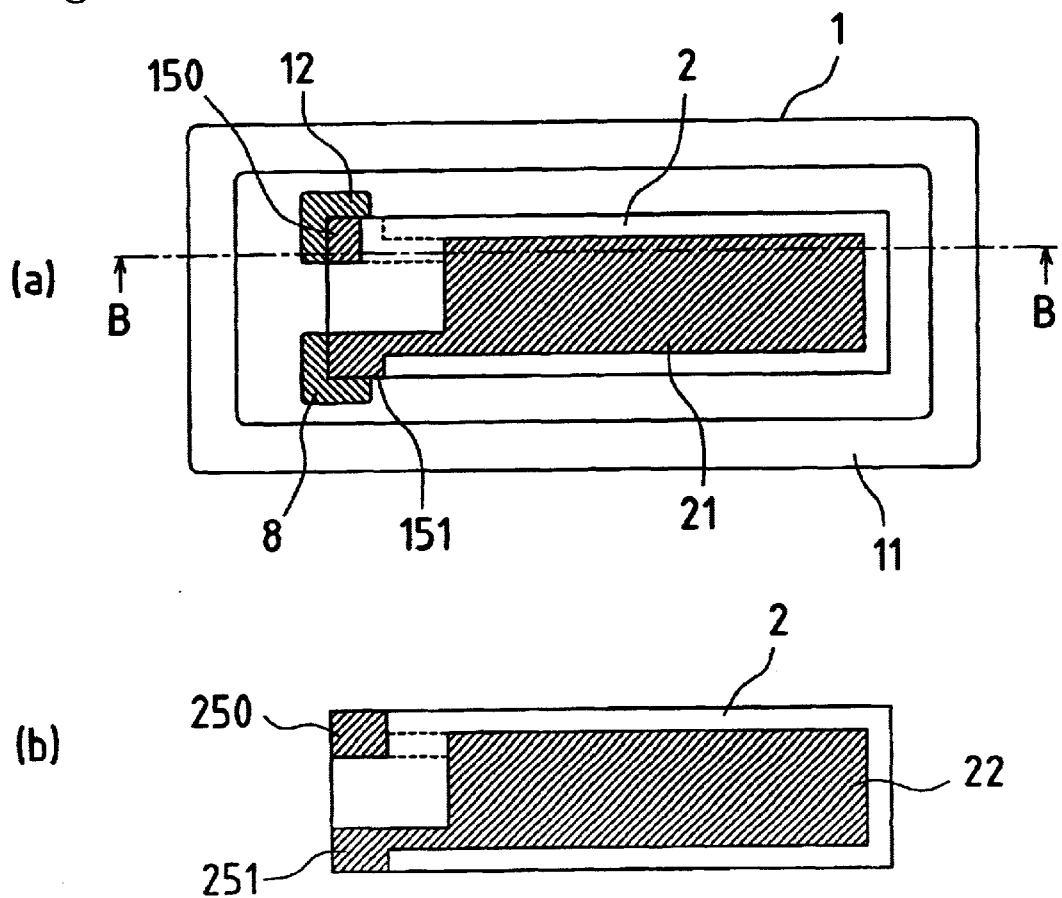
FIG. 9(a) is a plan view showing the fifth embodiment of the present invention.
FIG. 9(b) illustrates the quartz oscillating plate of the fifth embodiment of the present invention, as seen from the base side.
Figure 10:
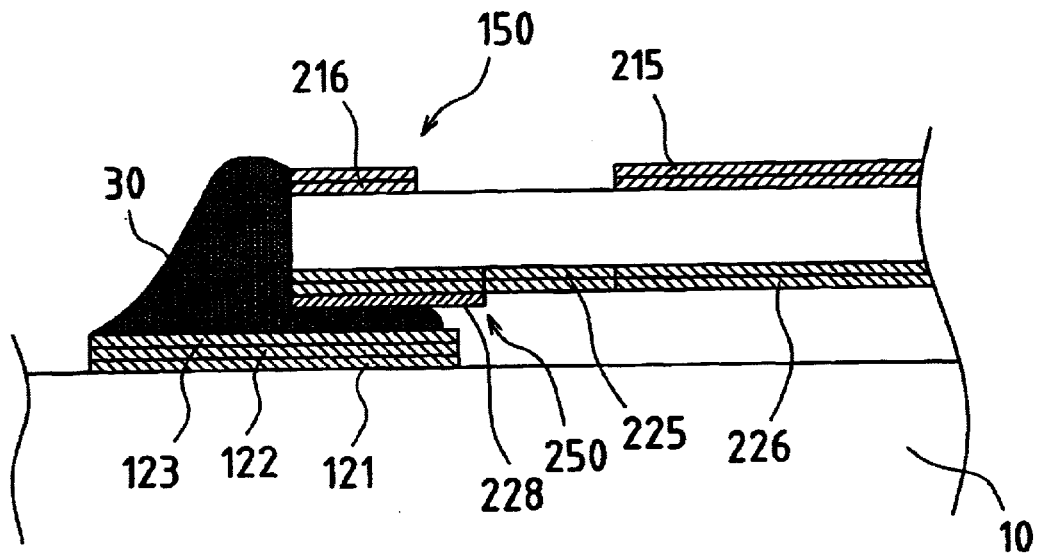
FIG. 10 is a sectional view of the relevant part, taken along the line B—B in FIG. 9(a).

FIG. 9(a) is a plan view showing the fifth embodiment of the present invention. FIG. 9(b) illustrates the quartz oscillating plate of the fifth embodiment of the present invention, as seen from the base side. FIG. 10 is a sectional view of the relevant part, taken along the line B—B in FIG. 9(a).

The structures similar to those mentioned in the first embodiment are mentioned by the same reference signs without further explanations.

This embodiment is distinguished from the first embodiment in the structure of the excitation electrodes and the lead electrodes.

The excitation electrodes 21, 22 are provided on both major surfaces of the quartz oscillating plate 2. Lead electrodes 150, 151 are drawn out of the excitation electrode 21 to the sections of the electrode pads 12, 16. On the other surface, lead electrodes 250, 251 are provided opposite to where the lead electrodes 150, 151 are bonded to the electrode pads 12, 16.

As depicted in FIG. 9(a), the lead electrodes 150, 151 on the first major surface are different in size and shape from each other. Turning to FIG. 9(b), the lead electrodes 250, 251 on the second major surface are designed in the same electrode pattern. Thus, as a whole, the lead electrodes on these major surfaces have distinct electrode patterns from each other, according to this structure. Consequently, regarding the quartz oscillating plate which mounts these electrodes, it is possible to tell the front surface from the back surface, by detecting the difference of the size or shape with the image processing technology using a digital camera or the like.

For the excitation electrode 21 and the lead electrodes 150, 151, 250, 251 of this embodiment, the respective major surfaces of the quartz oscillating plate 2 are successively laminated with first Cr film layers 216, 225 with a thickness of about 16 Å, and Au film layers 215, 226 with a thickness of about 5,000 Å. Further, a second Cr film layer 227 with a thickness of about 10 Å is formed only where the lead electrodes 250, 251 are bonded to the electrode pads 12, 16 via the silicone-based conductive adhesive 30.

Figure 11:
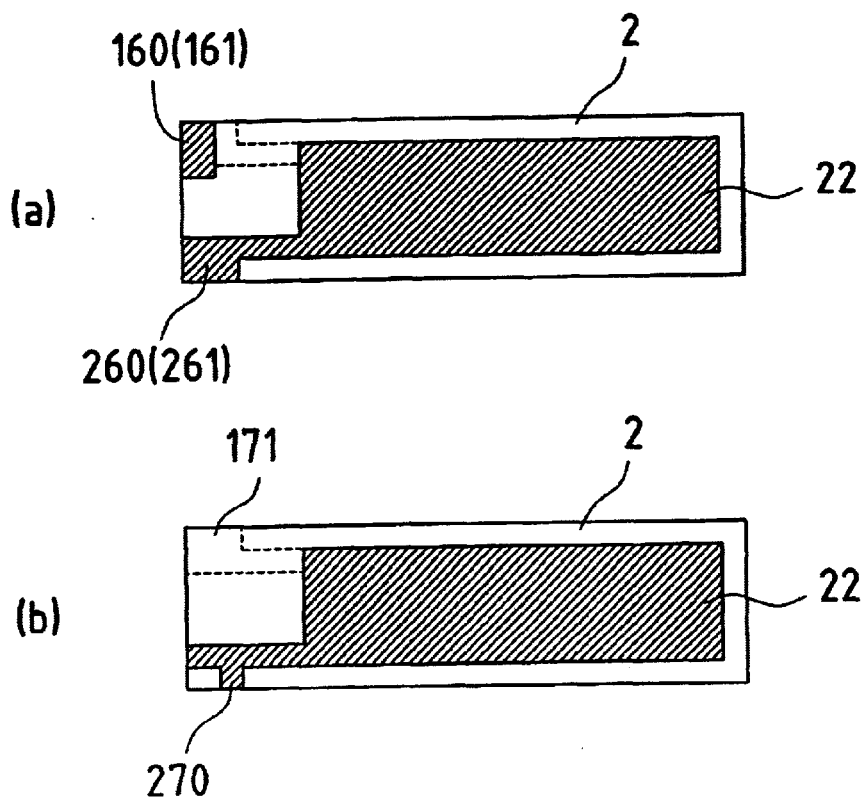
FIG. 11(a) and FIG. 11(b) are plan views showing the first and second modified examples of the fifth embodiment, respectively.
Figure 13:
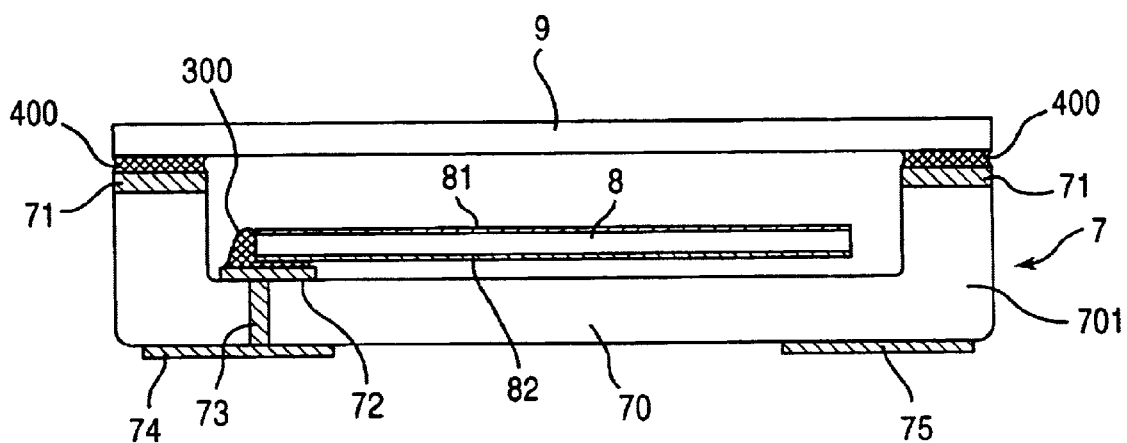
FIG. 13 is a sectional view showing a conventional example.

In addition to the above structure, there may be mentioned some examples where the lead electrodes on the respective major surfaces have different electrode patterns from each other. FIG. 11(a) and FIG. 11(b) are plan views showing the first and second modified examples of the fifth embodiment, respectively.

According to the first modified example, the lead electrodes at the first electrode pad side are different between the front major surface and the back major surface. Namely, the lead electrode 160 formed on the front major surface is different in size and shape from the lead electrode 161 formed on the back major surface. At the second electrode pad side, the lead electrode 260 on the front major surface has an identical pattern with the lead electrode 261 on the back major surface.

In the second modified example, neither of the lead electrodes 171, 270 extends onto the opposite major surface. Besides, the lead electrodes 171, 270 are configured distinctively from each other.

According to the above-described fifth embodiment, the front and back of the lead electrodes is distinguishable, based on the shape and size of their electrode patterns. Moreover, owing to the transparent quartz oscillating plate, the electrode patterns of the lead electrodes on the first major surface can be easily identified by the shape and size from the second major surface side.

In the present embodiments described hereinbefore, the quartz oscillator device is typically represented by a quartz oscillator. However, these embodiments are applicable, without limitation, to other quartz oscillator devices such as quartz filters and quartz generators.

EXAMPLES

FIG. 12 is a table which gives the results of the drop test conducted for examples of the present invention and a conventional example, in which the results are indicated by the percentage of good items. The test procedure and the modes of samples used in the respective examples and the conventional example are mentioned below.

The quartz oscillators for this test commonly adopted the structure shown in FIG. 1. Specifically, with the use of the silicone-based conductive adhesive 30, the electrode pad 12 (16) provided at the internal bottom of the ceramic package 1 was bonded electrically and mechanically to the lead electrodes 210, 220 (230, 240) which were formed on the quartz oscillating plate 2 along with the excitation electrodes 21, 22. After the baking treatment, nitrogen gas was enclosed to create a hermetic atmosphere. In this atmosphere, the metal lid 3 was sealed hermetically via a soldering silver to give the specified structure. As the silicone-based conductive adhesive 30, use was made of XA-670W (model name), manufactured by FUJIKURA KASET CO., LTD. Based on this structure, the quartz oscillator was modified with the following arrangements, giving 100 samples each for the respective arrangements. The drop test was carried out for these samples, and the percentage of good items was obtained.

In the drop test, the quartz oscillator was set on a reference jig for drop evaluation which had a rectangular solid shape and weighed 100 grams. One test cycle involved drops in each direction of the six sides. This cycle was repeated 20 times. Concerning the percentage of good items (%), a good item was defined as an item which showed a frequency variation rate (Δf/f) of not greater than ±2 ppm, and a CI variation of not greater than 2Ω. The modes of the respective samples are mentioned below.

As the samples of the conventional item, each electrode pad in the ceramic package comprises a metallized layer made of W (tungsten), a Ni-plated film layer with a thickness of about 5 μm, and a Au-plated film layer with a thickness of about 1 μm, which are laminated in this order. For the lead electrodes and the excitation electrode, a 16 Å-thick Cr-sputtered film layer and a 5,000 Å-thick Au-sputtered film layer are successively laminated on each major surface of the quartz oscillating plate.

As the samples for Example A, each electrode pad in the ceramic package comprises a metallized layer made of W (tungsten), a 5-μm-thick Ni-plated film layer, and a 1-μm-thick Au-plated film layer, which are laminated in this order. For the lead electrodes and the excitation electrode, a 16 Å-thick first Cr-sputtered film layer, a 5,000 Å-thick Au-sputtered film layer, and a 5 Å-thick second Cr-sputtered film layer are successively laminated on each major surface of the quartz oscillating plate. In a vacuum atmosphere, the entire ceramic package is heated around 300° C. for 2 hours.

The samples for Examples B–G are arranged in a manner similar to Example A, except for the thickness of the second Cr-sputtered film layer. In the samples of Examples B, C, D, E, F and G, the second Cr-sputtered film layer has a thickness of 10 Å, 20 Å, 30 Å, 40 Å, 50 Å and 60 Å, respectively.

As to the samples for Example H, each electrode pad in the package comprises a metallized layer made of W (tungsten), a 5-μm-thick Ni-plated film layer, a 1-μm-thick Au-plated film layer, and a 30 Å-thick Ag film layer, which are laminated in this order. For the lead electrodes and the excitation electrode, a 16 Å-thick first Cr-sputtered film layer, a 5,000 Å-thick Au-sputtered film layer, and a 10 Å-thick second Cr-sputtered film layer are successively laminated on each major surface of the quartz oscillating plate.

Regarding the samples for Example I, each electrode pad in the ceramic package comprises a metallized layer made of W (tungsten), a 5-μm-thick Ni-plated film layer, and a 1-μm-thick Au-plated film layer, which are laminated in this order. For the lead electrodes and the excitation electrode, a 16 Å-thick first Cr-sputtered film layer and a 5,000 Å-thick Au-sputtered film layer are successively laminated on each major surface of the quartz oscillating plate. A 10 Å-thick second Cr-sputtered film layer is formed only on the lead electrode section locating on the electrode pad side. In a vacuum atmosphere, the entire ceramic package is heated around 300° C. for 2 hours.

The samples for Examples J and K are arranged in a manner similar to Example I, except for the thickness of the second Cr-sputtered film layer which is formed only on the lead electrode section locating on the electrode pad side. In the samples of Examples J and K, the second Cr-sputtered film layer has a thickness of 20 Å and 30 Å, respectively.

As evident from FIG. 12, the present examples are improved in impact resistance over the conventional item. The impact resistance gets better along with increase of the thickness of the uppermost Cr film layer in the lead electrode. Thus, a Cr film layer having a thickness of 5 Å or greater results in improvement of the impact resistance. However, an excessively thick Cr film may act as a factor of decreasing the conductivity or hampering the oscillations. Hence, the film thickness should be set in consideration of such relationship. The thickness of the uppermost Cr film is understood to be an average film thickness.

Figure 5:
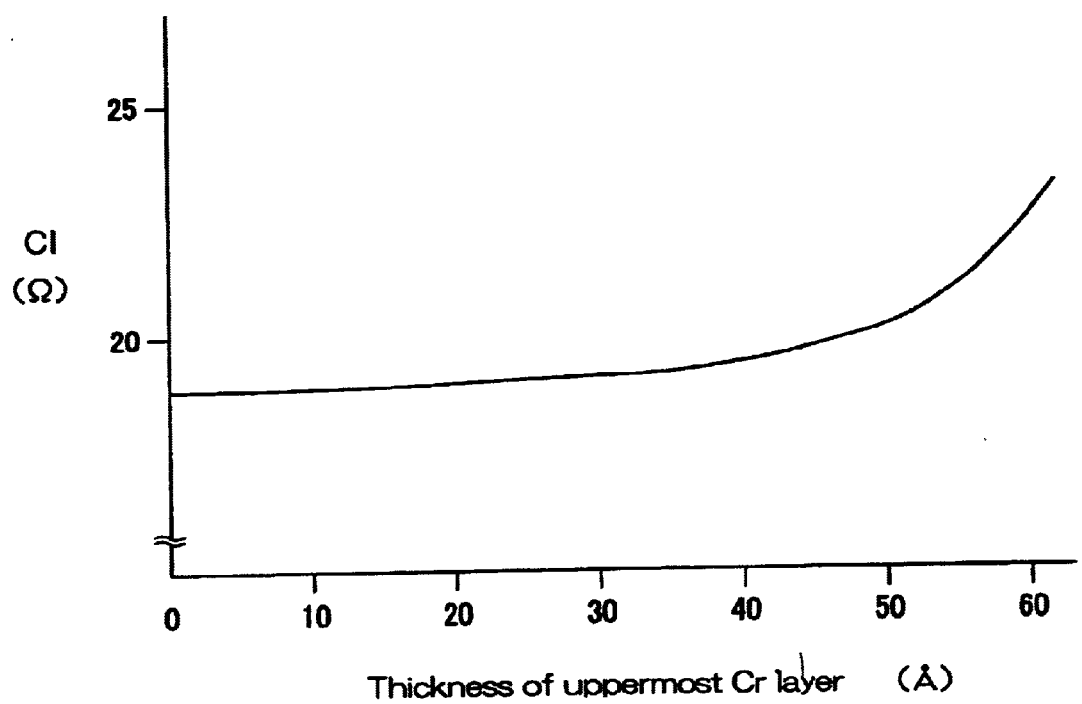
FIG. 5 is a diagram which represents the relation between the CI and the film thickness of the uppermost Cr film layer in the quartz oscillator device.

With respect to the samples of the conventional item and Examples A–G, FIG. 5 shows the variations of CI, based on the thickness of the uppermost Cr film layer in each excitation electrode or the lead electrode.

The CI is plotted according to the average of each sample. As apparent from FIG. 5, once the predetermined thickness of the Cr film exceeds 50 Å, the CI increases exponentially and deteriorates. At the same time, variations of the CI become wider (not shown). Judging from FIG. 5, a Cr film thickness of 50 Å or less can ensure a relatively good CI, and a Cr film thickness of 30 Å or less can guarantee a more preferable CI.

In view of the above verification data, a proper thickness for the Cr film is about 5 to 50 Å, more preferably 5 to 30 Å, as the uppermost layer in each excitation electrode or the lead electrode. The film thickness is understood to be an average film thickness.

The next description relates to the verification test and test result of the milling rate during frequency adjustment. The test was conducted with respect to the following cases: where the Cr films were formed on both major surfaces of the quartz oscillating plate, as the uppermost layers for the excitation electrodes and the lead electrodes (Example C); and where the Cr film locates only at the lead electrode section on the electrode pad side (Example J).

The quartz oscillators of Example C and Example J were subjected to ion milling using Ar gas, whereby the film thickness of the electrodes were reduced to achieve a predetermined frequency adjustment. The time required for this adjustment was measured. The verification was performed with respect to 5 lots of samples, each lot being made up of 144 sample pieces. The target frequency was set at 24.576 MHz, whereas the frequencies given by the respective samples were 20 to 30 KHz lower, on average, than the target frequency. This meant that the electrode had an excessive film thickness.

Referring to the result of this verification test, Example J and Example C were compared. The comparison showed that every lot of the former was processed quicker than every lot of the latter by an average of 210 seconds. In terms of the processing time for a piece of the sample, the former required approximately 1.46 seconds less than the latter. This comparison confirmed the improvement in frequency adjustment rate, in other words, milling rate. This is probably because the hard Cr film (including an oxidized $CrO_2$), which is harder than the Au film, lowers the milling rate. Accordingly, the above result supports the reason why Example C, in which the Cr films locate on both major surfaces of the quartz oscillating plate, took a longer time in the milling treatment than Example J, in which the Cr film is formed only on one of the major surfaces.

Industrial Applicability

As has been described, the quartz oscillator device of the present invention, which includes a cantilevered support structure using a silicone-based conductive adhesive, is superior not only in support strength and impact resistance but also in terms of durability. Besides, the quartz oscillator device contributes to improvement of the production rate in the industrial production, by enabling an efficient frequency adjustment to be conducted in a later step.

What is claimed is:

1. A quartz oscillator device comprising a quartz oscillating plate having two major surfaces, each of which is formed with an excitation electrode and lead electrodes drawn out of the excitation electrode, and electrode pads formed on a base, the quartz oscillating plate and the electrode pads being electrically connected via a silicone-based conductive adhesive, characterized in that each electrode pad comprises a metallized layer made of tungsten or molybdenum, a Ni film layer and a Au film layer, which are laminated on the base in this order; and that Ni in the Ni in the film layer is diffused at least into a predetermined area of the Au film layer in each electrode pad where the silicone-based conductive adhesive is applied.

2. A quartz oscillator device comprising a quartz oscillating plate having two major surfaces, each of which is formed with an excitation electrode and lead electrodes drawn out of the excitation electrode, and electrode pads formed on a base, the quartz oscillating plate and the electrode pads being electrically connected via a silicone-based conductive adhesive, characterized in that each electrode pad comprises a metallized layer made of tungsten or molybdenum, a Ni film layer and a Au film layer, and a thin Ag film layer or a thin Al film layer, which are laminated on the base in this order.

3. A quartz oscillator device comprising a quartz oscillating plate having two major surfaces, each of which is formed with an excitation electrode and lead electrodes drawn out of the excitation electrode, and electrode pads formed on a base, the quartz oscillating plate and the electrode pads being electrically connected via a silicone-based conductive adhesive, characterized in that each electrode pad comprises a metallized layer made of tungsten or molybdenum, a Ni film layer and a Au film layer, which are laminated on the base in this order;

that Ni in the Ni film layer is diffused at least into a predetermined area of the Au film layer in each electrode pad where the silicone-based conductive adhesive is applied; and among the excitation electrode and the lead electrodes, at least each of the lead comprises a Cr film layer, a Au film layer, and a thin Cr film layer or a thin Ag film layer, which are laminated on the quartz oscillating plate in this order.

4. A quartz oscillator device comprising a quartz oscillating plate having two major surfaces, each of which is formed with an excitation electrode and lead electrodes drawn out of the excitation electrode, and electrode pads formed on a base, the quartz oscillating plate and the electrode pads being electrically connected via a silicone-based conductive adhesive, characterized in that each electrode pad comprises a metallized layer made of tungsten or molybdenum, a Ni film layer and a Au film layer, and a thin Ag film layer or a thin Al film layer, which are laminated on the base in this order; and among the excitation electrode and the lead electrodes, at least each of the lead electrodes comprises a Cr film layer, a Au film layer, and a thin Cr film layer or a thin Ag film layer, which are laminated on the quartz oscillating plate in this order.

5. A quartz oscillator device comprising a quartz oscillating plate having two major surfaces, each of which is formed with an excitation electrode and lead electrodes drawn out of the excitation electrode, and electrode pads formed on a base, the quartz oscillating plate and the electrode pads being electrically connected via a silicone-based conductive adhesive, characterized in that each of the excitation electrode and the lead electrodes comprises a Cr film layer and a Au film layer, which are laminated on the quartz oscillating plate in this order; and that, among the lead electrodes and the excitation electrode which are opposite to the base, at least each of the lead electrodes comprises a thin Cr film layer or a thin Ag film layer which is laminated on the Au film layer of the lead electrode, wherein each electrode pad comprises a metallized layer made of tungsten or molybdenum, a Ni film layer and a Au film layer, which are laminated on the base in this order; and that Ni in the Ni film layer is diffused at least into a predetermined area of the Au film layer in each electrode pad where the silicone-based conductive adhesive is applied.

6. A quartz oscillator device comprising a quartz oscillating plate having two major surfaces, each of which is formed with an excitation electrode and lead electrodes drawn out of the excitation electrode, and electrode pads formed on a base, the quartz oscillating plate and the electrode pads being electrically connected via a silicone-based conductive adhesive, characterized in that each of the excitation and the lead electrodes comprises a Cr film layer and a Au film layer, which are laminated on the quartz oscillating plate in this order; and that, among the lead electrodes and the excitation electrode which are opposite to the base, at least each of the lead electrodes comprises a thin Cr film layer or a thin Ag film layer which is laminated on the Au film layer of the lead electrode, wherein each electrode pad comprises a metallized layer made of tungsten or molybdenum, a Ni film layer, a Au film layer, and a thin Ag film layer or a thin Al film layer, which are laminated on the base in this order.

7. A quartz oscillator device according to claim 1, 2, 5 or 6, characterized in that the thin Cr film layer or the thin Ag film layer has a thickness of 5 to 50 Å.

8. A quartz oscillator device according to claim 5 or 6, characterized in that the lead electrodes formed on both major surfaces of the quartz oscillating plate are different from each other in shape or size of the electrode pattern.

9. A quartz oscillator device according to claim 1, 2, 3 or 4 characterized in that, among the excitation electrode and the lead electrodes, at least each of the lead electrodes comprises a Cr film layer, a Au film layer, and a thin Cr film layer or a thin Ag film layer, which are laminated on the quartz oscillating plate in this order.

* * * * *